(12) United States Patent
Bobier et al.

(10) Patent No.: US 7,924,936 B2
(45) Date of Patent: Apr. 12, 2011

(54) SYSTEM AND METHOD FOR WAVE DAMPING

(75) Inventors: Joseph A. Bobier, Sunrise, FL (US); Nadeem Khan, Sunrise, FL (US)

(73) Assignee: XG Technology, Inc., Sarasota, FL (US)

( * ) Notice: Subject to any disclaimer, the term of this patent is extended or adjusted under 35 U.S.C. 154(b) by 634 days.

(21) Appl. No.: 11/807,036

(22) Filed: May 25, 2007

(65) Prior Publication Data

US 2007/0291892 A1    Dec. 20, 2007

Related U.S. Application Data

(60) Provisional application No. 60/814,799, filed on Jun. 19, 2006.

(51) Int. Cl.
*H03C 1/52* (2006.01)
*H04L 27/02* (2006.01)

(52) U.S. Cl. ........................................................ 375/270

(58) Field of Classification Search ................. 375/133, 375/139, 146, 230, 237, 242, 268, 270, 271, 375/275, 295, 335, 346, 348, 350, 377; 342/13, 342/21, 27, 159, 201; 333/18, 100, 173, 333/193, 196
See application file for complete search history.

(56) References Cited

U.S. PATENT DOCUMENTS

| | | | | |
|---|---|---|---|---|
| 3,638,122 A * | 1/1972 | Gibson | ......................... | 375/230 |
| 5,396,520 A * | 3/1995 | Degges | ......................... | 375/316 |
| 5,504,774 A * | 4/1996 | Takai et al. | ..................... | 375/134 |
| 5,675,609 A * | 10/1997 | Johnson | ......................... | 375/237 |
| 6,069,580 A * | 5/2000 | Martinson | ....................... | 342/20 |
| 6,122,332 A * | 9/2000 | Ogata et al. | .................. | 375/346 |
| 6,731,569 B2 | 5/2004 | Yurchenko et al. | | |
| 7,079,450 B2 | 7/2006 | Breed et al. | | |
| 7,209,523 B1 * | 4/2007 | Larrick et al. | ................. | 375/295 |
| 7,257,148 B2 * | 8/2007 | Suzuki | .......................... | 375/146 |
| 2004/0120421 A1 * | 6/2004 | Filipovic | ....................... | 375/316 |
| 2006/0114969 A1 * | 6/2006 | Ahn et al. | ..................... | 375/139 |

* cited by examiner

*Primary Examiner* — David C. Payne
*Assistant Examiner* — Syed Haider
(74) *Attorney, Agent, or Firm* — Dennis L. Cook, Esq.

(57) ABSTRACT

A system and method of damping the ringing response of Band Pass Filters for use in impulse and single cycle modulation systems which are capable of carrying a high data rate and which are severely affected by the ringing response of the Band Pass Filter.

7 Claims, 6 Drawing Sheets

Frequency response of SAW filter

: Dirac Delta Function

Impulse response of the 14MHz SAW filter

Output response of the 14MHz SAW filter

SYSTEM AND METHOD FOR WAVE DAMPING

CROSS-REFERENCE TO RELATED APPLICATION

The present application claims the benefit of previously filed Provisional Patent Application, Ser. No. 60/814,799.

FIELD OF THE INVENTION

This invention addresses the need to transport high bit-rate data over wired or wireless means using specially modulated radio frequency carrier waves. Specifically, a wave damping technique is described in this disclosure that dampens the ringing response of SAW filters further enabling specially modulated radio frequency carrier waves.

BACKGROUND OF THE INVENTION

Modulation is the fundamental process in any communication system. It is a process to impress a message (voice, image, data, etc.) on to a carrier wave for transmission. A band-limited range of frequencies that comprise the message (baseband) is translated to a higher range of frequencies. The band-limited message is preserved, i.e., every frequency in that message is scaled by a constant value. The three key parameters of a carrier wave are its amplitude, its phase and its frequency, all of which can be modified in accordance with an information signal to obtain the modulated signal.

There are various shapes and forms of modulators. For example conventional Amplitude Modulation uses a number of different techniques for modulating the amplitude of the carrier in accordance with the information signal. These techniques have been described in detail in "Modern Analog and Digital Communication Systems" by B. P. Lathi. Similarly conventional Frequency/Phase Modulation uses a number of different methods described in a number of textbooks. In all these techniques, carrier (which is a high frequency sinusoidal signal) characteristics (either amplitude, frequency, phase or combination of these) are changed in accordance with the data (or information signal). Thus there has been two major components of a modulator. One is the information-carrying signal and the other is the high frequency carrier. A wave damping technique is described in this disclosure that dampens the ringing response of SAW filters further enabling specially modulated radio frequency carrier waves.

In any communication system, band pass filters are used to band limit the bandwidth of the signal. For example, they are used in transmitters to allow necessary signals to pass to the next stage and in receivers they are used to block any unwanted signals. Although they are integral part of any communication system and have numerous advantages, they have one major disadvantage. This disadvantage is the ringing effect of the band pass filter i.e. when a band pass filter is injected with a unit impulse signal; the filter rings for some time even after the signal is removed from the input. This ringing of the band pass filter is a function of bandwidth of the filter and in technical terms is referred to as the Impulse response of the filter. The narrower the bandwidth of the filter (higher Q) the more the ringing, and vice versa. The impulse response also dictates what the maximum allowable data rate is passing through such a filter. In a low data rate system, the ringing is not an issue, however, in a high data rate system, like the xMax system described below, the ringing severely degrades system throughput performance. Band Pass filters come in many shapes and forms. Most of the communication systems these days use SAW (Surface Acoustic Wave) filters. Saw filters save a lot of real estate on the printed circuit board. Saw filters are cheaper and easier to use than discrete Band Pass Filters (BPF). However, they inherit the same disadvantage as that of band pass filter, the ringing. This disclosure describes a method of damping the ringing response of band pass filters, including SAW filters, and shows an example of how this damping circuitry is used in an xMax type system.

Communication systems that have emerged in recent years include mono-pulse and Ultra-Wide Band communication systems. The problem with these systems is that all mono-pulse or Ultra-Wide Band communications systems form Power Spectrum Densities that tend to span very wide swaths of the radio spectrum. For instance the FCC has conditionally allowed limited power use of UWB from 3.2 GHz to 10 GHz. These systems must make use of very wide sections of radio spectrum because the transmit power in any narrow section of the spectrum is very low. Generally any 4 KHz section of the affected spectrum will contain no more than −42 dbm of UWB spectral power. Correlating receivers are used to "gather" such very wide spectral power and concentrate it into detectable pulses. Interfering signals are problematic. Since the communication system is receiving energy over a very wide spectrum, any interfering signal in that spectrum must be tolerated and mitigated within the receiver. Many schemes exist to mitigate the interference. Some of these include selective blocking of certain sections of spectrum so as not to hear the interferer, OFDM schemes that send redundant copies of the information in the hope that at least one copy will get through interference, and other more exotic schemes that require sophisticated DSP algorithms to perform advanced filtering. In addition, UWB systems have somewhat of a "bad reputation" because they at least have the potential to cause interference. A heated discourse has gone on for years over the potential that UWB systems can cause interference to legacy spectrum users.

Tri-State Integer Cycle Modulation (TICM) and other Integer Cycle Modulation techniques were designed by the inventors of this application to help alleviate this massive and growing problem which has now become known by its commercial designation, xMax. Its signal characteristics are such that absolute minimal sideband energy is generated during modulation but that its power spectrum density is quite wide relative to the information rate applied. Also, a narrower section of the power spectrum output can be used to represent the same information. The technique of wave damping disclosed herein is primarily applicable to these types of single cycle systems.

As described above, a signal passing through a BPF experiences ringing, thus any single cycle system, like xMax, capable of carrying a high date rate, will be severely affected by the ringing response of the BPF. Since the ringing response of the BPF is fixed and cannot be changed, additional circuitry has to be used that reduces, or damps, the ringing of the SAW filter making the system capable of sending high data rates. One such approach is described in this disclosure.

BRIEF SUMMARY OF THE INVENTION

The invention disclosed in this application uses any integer cycle or impulse type modulation and more particularly is designed to work with a method of modulation named Tri-State Integer Cycle Modulation (TICM) which has been previously disclosed in U.S. Pat. No. 7,003,047 issued Feb. 21, 2006, filed by one of the inventors of this disclosure. In any communication system, band pass filters are used to band limit the bandwidth of the signal. For example, they are used in transmitters to allow necessary signals to pass to the next stage and in receivers they are used to block any unwanted signals. Although they are integral part of any communication system and have numerous advantages, they have one major disadvantage. This disadvantage is the ringing effect of the band pass filter, i.e. when a band pass filter is injected with a unit impulse signal; the filter rings for some time even after the signal is removed from the input. This ringing of the band pass filter is a function of the bandwidth of the filter and in technical terms is referred to as the Impulse Response of the filter. The narrower the bandwidth of the filter, higher Q, the more the ringing, and vice versa. The impulse response also dictates what the maximum allowable data rate is passing through such a filter. In a low data rate system, the ringing is not an issue, however, in a high data rate system, like the xMax system described herein, the ringing severely degrades system throughput performance. Band Pass filters come in many shapes and forms. Most of the communication systems these days use SAW (Surface Acoustic Wave) filters. SAW filters save a lot of real estate on the printed circuit board. SAW filters are cheaper and easier to use than discrete band pass filters. However, they inherit the same disadvantage as that of other band pass filters, the ringing. This disclosure describes a method of damping the ringing response of the BPF, including SAW filters, and shows an example of how this damping circuitry is used in an xMax type system.

For a fuller understanding of the nature and objects of the invention, reference should be made to the following detailed description taken in connection with the accompanying drawings.

DESCRIPTION OF THE DRAWINGS

For a fuller understanding of the nature and objects of the invention, reference should be made to the accompanying drawings, in which.

DETAILED DESCRIPTION OF THE INVENTION

The invention disclosed in this application uses any integer cycle, ultra-wide band, or impulse type modulation and more particularly is designed to work with a method of modulation named xMax which has been described above.

Figure 1:
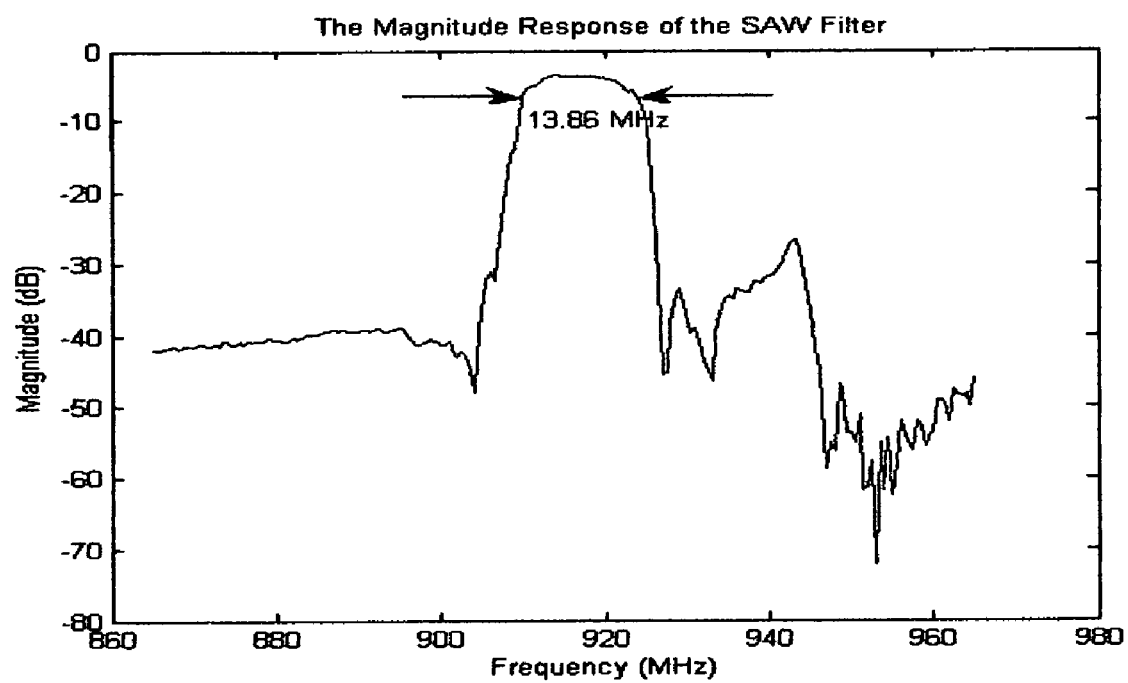
FIG. 1 is a representation of typical frequency response of a SAW filter.

Consider a SAW filter centered at 915 MHz with a bandwidth of 14 MHz. This type of SAW filter is commonly used for ISM 900 MHz applications like cordless phones, low power transmitters, etc. The frequency response of this SAW filter is shown in FIG. 1. Because the frequency response of the filter gives no information about the impulse response of such filter, we have to calculate the impulse response of this filter.

Figure 2:
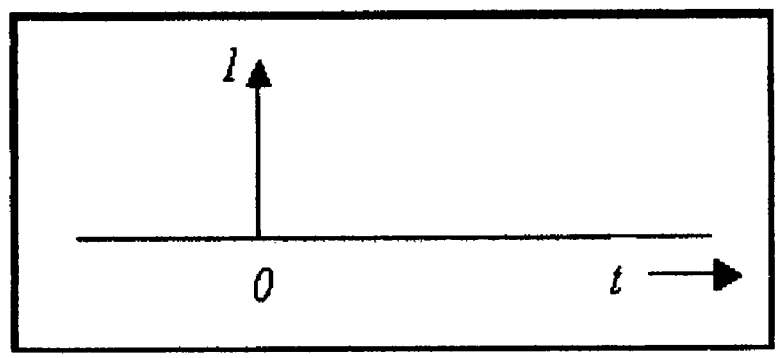
FIG. 2 is a representation of a Dirac Delta Function.

The impulse response of a filter is usually derived by passing a Dirac Delta signal (simply known as delta function) at the input of the SAW filter. The Delta function is defined as: The Dirac Delta function, often referred to as the unit impulse or delta function, is the function that defines the idea of a unit impulse. This function is one that is infinitesimally narrow, infinitely tall, yet integrates to unity, one. This function can be visualized as shown in FIG. 2.

Figure 3:
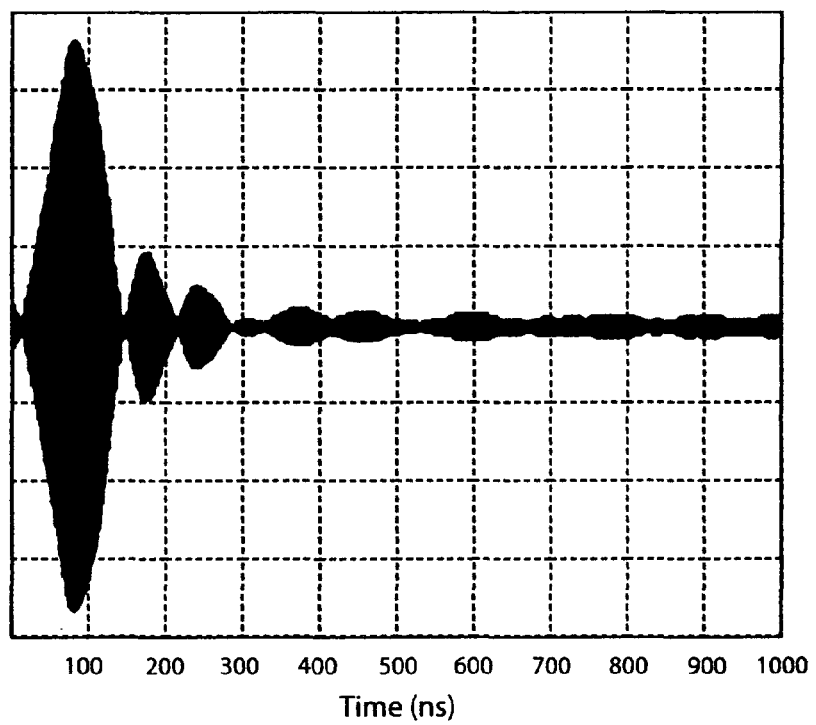
FIG. 3 is a representation of an impulse response of a SAW filter.
Figure 4:
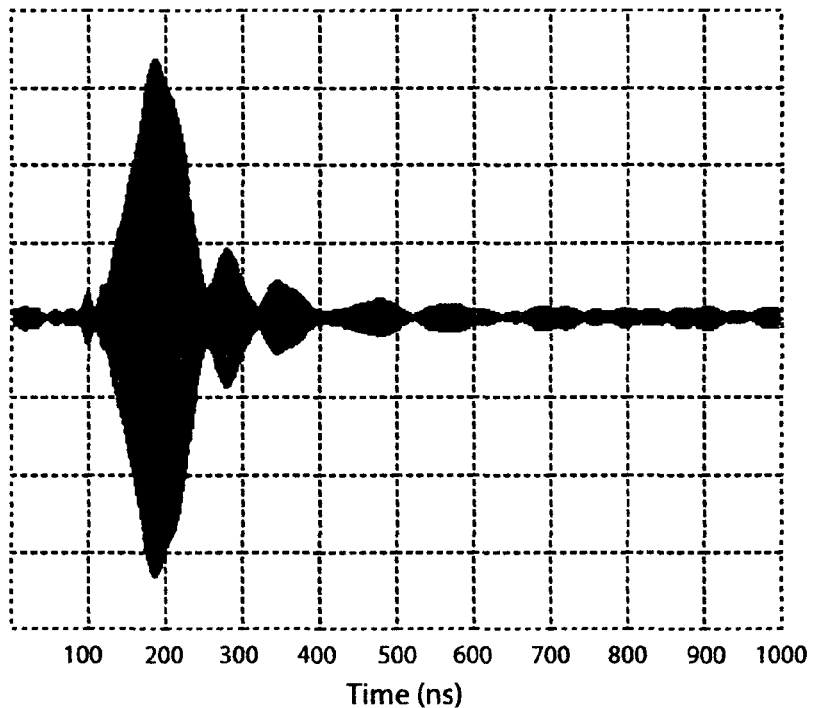
FIG. 4 is a representation of an xMax signal passing through a SAW filter.

When such a signal is applied to a SAW filter (described above), an output signal is formed as shown in FIG. 3. From FIG. 3, it is clear that the output of the SAW filter starts at time t=0, grows to a peak amplitude at time t=80 nsec and then starts falling. This process is repeated for a number of times. Even though the input is applied for a very short amount of time, the signal at the output of the SAW filter remain for at least 148.5 nsec. In other words, the SAW filter rings for 148.5 nsec. The wider the bandwidth of SAW filter, the less is the ringing time and vice versa. If a single cycle signal (like xMax) is applied to such a SAW filter chain, the output of the SAW filter will look like FIG. 4.

Figure 5:
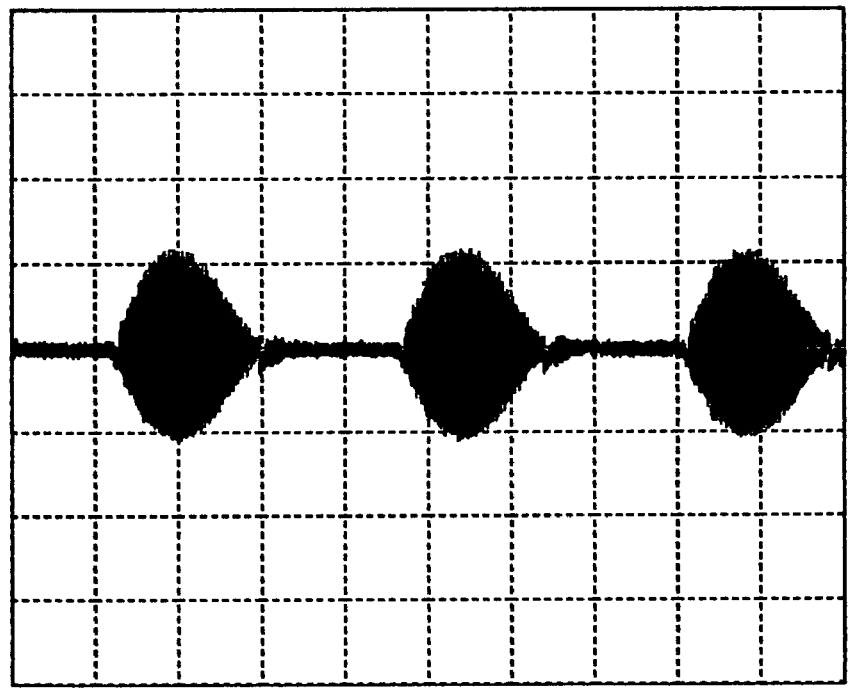
FIG. 5 is a representation of three xMax signal pulses after passing through a chain of three SAW filters.

Usually in a communication system there are multiple SAW filters in a transmitter. If we have a chain of three SAW filters, the xMax signal pulses, after passing through these three saw filters, will look like FIG. 5. Usually the main lobe carries most of the power and is necessary for successful signal demodulation. This is where the wave-damping scheme of this invention is useful. The wave damping scheme is a switch that turns on and off at regular times allowing only the main lobe to pass through it, thus blocking or removing all the unnecessary information that exists between xMax pulses. When a typical xMax signal (as shown in FIG. 5) is passed through such a wave damping circuit, all the unnecessary information between the pulses is removed. The output signal is shown in FIG. 6.

Figure 6:
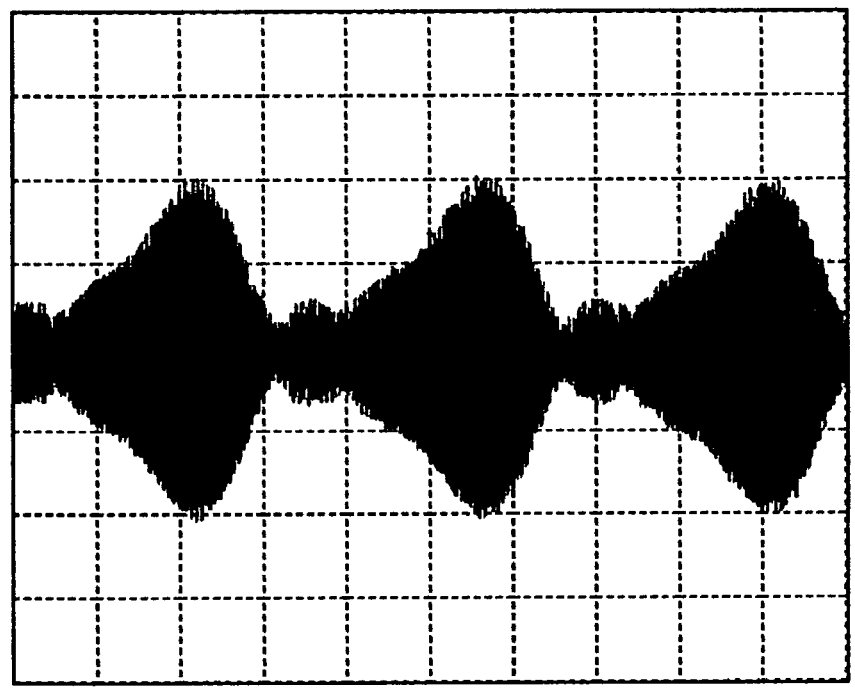
FIG. 6 is a representation of three xMax signal pulses after passing through a chain of three SAW filters with the wave damping scheme included.

Notice the following differences between the pulses in FIGS. 5 and 6:

The pulses in FIG. 6 are cleaner, crispier and sharper with well-defined boundaries.

The pulses in FIG. 6 are slightly delayed as compared to the pulses in FIG. 5 because of the propagation delay of the wave damping circuit.

The amplitudes of the pulses in FIG. 6 are slightly lower than the pulses in FIG. 5 because of the insertion loss of the wave damping circuit.

Implementing a wave damping scheme in the circuit cleans up the entire unnecessary signal between the pulses leaving a time space between them. This time space can be used to send pulses from a second xMax transmitter, thus making possible a multiplexing system. The scheme also reduces the Inter-Symbol Interference (ISI) increasing the overall system throughput. The wave-damping scheme can be implemented in the transmitter and in the receiver. When implemented in the transmitter, it reduces the transmitted power, eliminates Inter-Symbol interference, increases system throughput, and allows easy implementation of multiplex schemes. When implemented in the receiver, it improves receiver signal to noise ratio, improves the Bit Error Rate (BER), and also saves power consumption.

As mentioned earlier, the wave-damping scheme cal be implemented by someone skilled in the art in a number of ways. Some of the most common ways one could implement this scheme are described in the following paragraphs.

Figure 7:
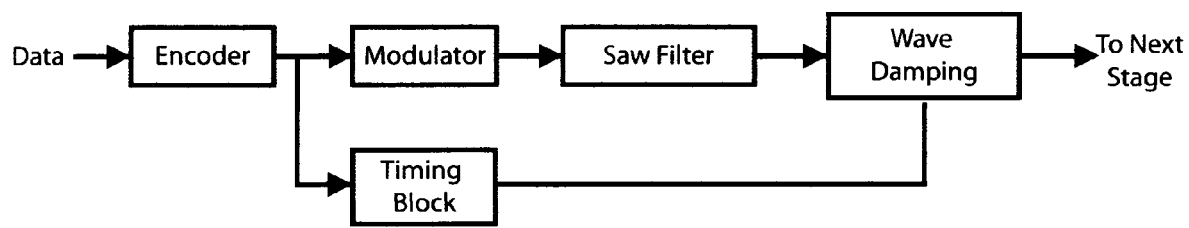
FIG. 7 is a series block diagram of a wave damping scheme.

In a Series implementation of this scheme, the wave damping circuit is applied in series with the output of a saw filter. The radio pulse is applied to the input of the saw filter. As indicated earlier, the saw filter rings for specific amount of time. The ringing signal is then fed into a wave-damping block where it is cleaned and tailored for the next stage. For multiple stage saw filters, series implementation can be applied at the output of each stage or it could be applied at the output of the final stage. The former implementation is more advantageous as it reduces the unnecessary signal growth in each stage. A generic block diagram for series implementation is shown in FIG. 7.

Encoded data is fed into modulator and to the timing block. The timing block generates a timing pulse that is compatible with the requirements of the wave damping block (for example signal level, signal type, etc). The timing block also delays the pulse so that it matches the propagation delay of the modulator and saw filter. The wave damping block acts like a switch turning on and off at the precise time (in accordance with the timing pulse) allowing only useful information to pass through and rejecting the ringing signal. The width of the timing pulse is adjustable. For multiple stage saw filters, this scheme can be implemented after every saw filter stage.

Figure 8:
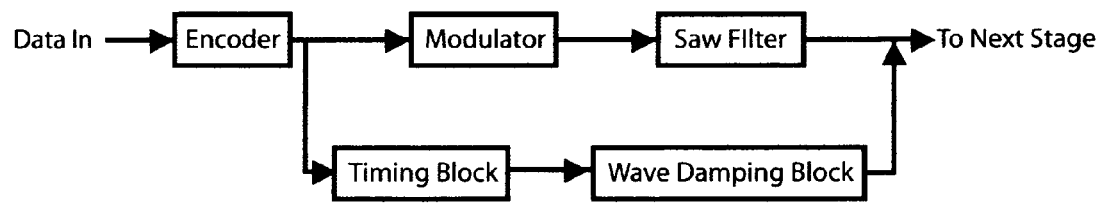
FIG. 8 is a parallel block diagram of a wave damping scheme.

In a parallel implementation scheme, the wave-damping block is placed in parallel with the SAW filter. The wave-damping block acts like a single pole single throw switch. It shorts the output of the saw filter to input of the filter, swamping the filter, thus removing the ringing effect of the saw filter instantaneously. A block diagram of such a scheme is shown in FIG. 8.

The timing block once again generates timing pulses, which are synchronized with the modulator and saw filter propagation delays. The wave-damping scheme acts like a single pole single throw switch. When the timing signal is logic high, the wave-damping block allows signal from saw filter to pass to next stage; when it is logic low, the wave damping scheme shunts the saw fitter output to the input. This effectively removes the saw filter from the circuit thus reducing the ringing. This scheme is better than the series implementation scheme because it does not give enough time to the saw filter to ring. For multiple stages saw filters, this scheme can be implemented in parallel with each saw filter stage.

In a shunted approach, the wave damping block is connected at the output of the saw filter. The ringing response of the saw filter depends on the Q of the saw filter. When a signal is applied to the input of the saw filter, the saw filter rings for a certain time. After a certain time, the timing block generates a pulse that causes the wave damping block to shunt the output of the saw filter to ground. Since the saw filter is shorted to ground, all the ringing energy is transferred to ground rather than to the next stage of the circuit, thus removing all the ringing energy.

Figure 9:
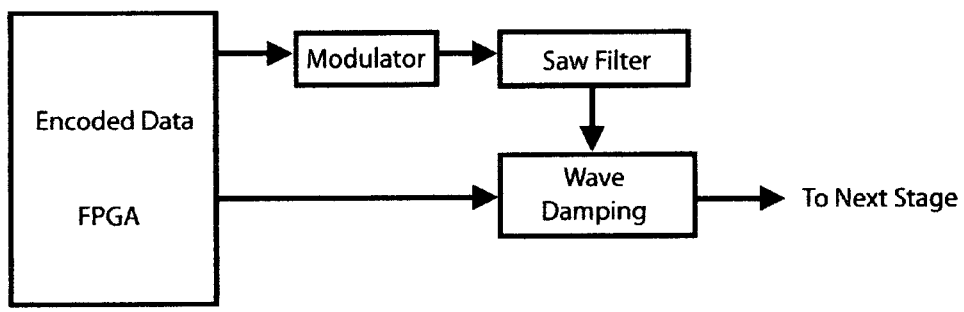
FIG. 9 is a programmable logic block diagram of a wave damping scheme.

Programmable logic (for example FPGA's) can also be used to implement the encoder and timing blocks. This reduces the real estate on the printed circuit board and improves system timing accuracy. The system is now software controlled and gives users the flexibility to change the propagation delay and pulse width of the timing pulse on the fly. Both series and parallel approaches can be implemented using this technique. A parallel approach using the FPGA is shown in FIG. 9.

Figure 10:
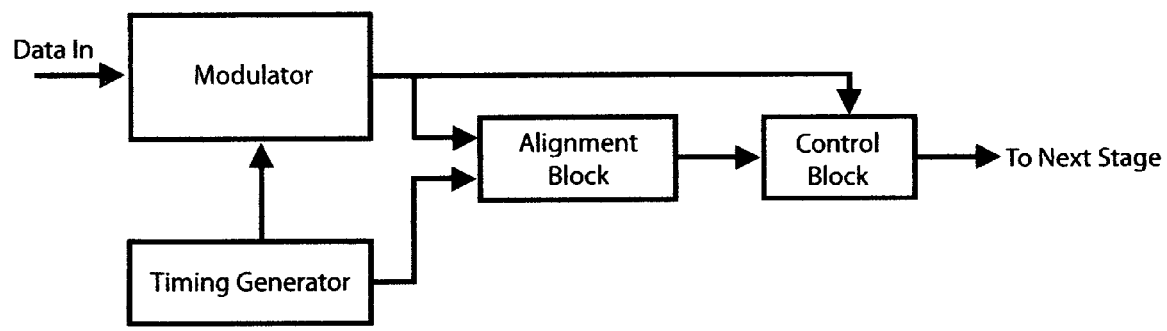
FIG. 10 is a generic block diagram of a wave damping scheme.

A generic block diagram of such a wave damping system implementing this disclosure in a further embodiment is shown in FIG. 10 and is made up of the following components:

Timing Generator: The timing generator generates timing pulses at regular intervals. The frequency, amplitude and phase of these pulses are controllable. This block could be implemented using a programmable oscillator or a fixed frequency oscillator capable of generating pulses at the required frequency as is well known to those skilled in the art. The output of this block is fed into the modulator and alignment blocks.

Modulator: The modulator block shown in the block diagram of FIG. 7 modulates the data. This block can be implemented in a number of ways. In the case of xMax modulation, the modulator takes the timing signal from the timing generator and modulates the incoming data using xMax modulation as described above.

Alignment Block: The function of the alignment block is to align the modulated data with the timing pulses. This block can be implemented in a number of ways. One widely used method to implement this block is through a Phase lock Loop, but any other circuit can be used to time align the modulated signal with the timing pulses as is well known to those skilled in the art. The output of this block results in timing pulses that are synchronized with modulated data signal.

Control Block: The control block acts like a switch. It turns on and off with timing pulses, allowing only a small portion of the modulated signal to pass through, thus removing all the unnecessary information between the modulated signal pulses. This block can be implemented in a variety of ways. For example a simple transmit receive switch with appropriate response characteristics can be used. An analog logic gate, a FET switch, or other devices well known to those skilled in the art can also be used for this application.

Figure 11:
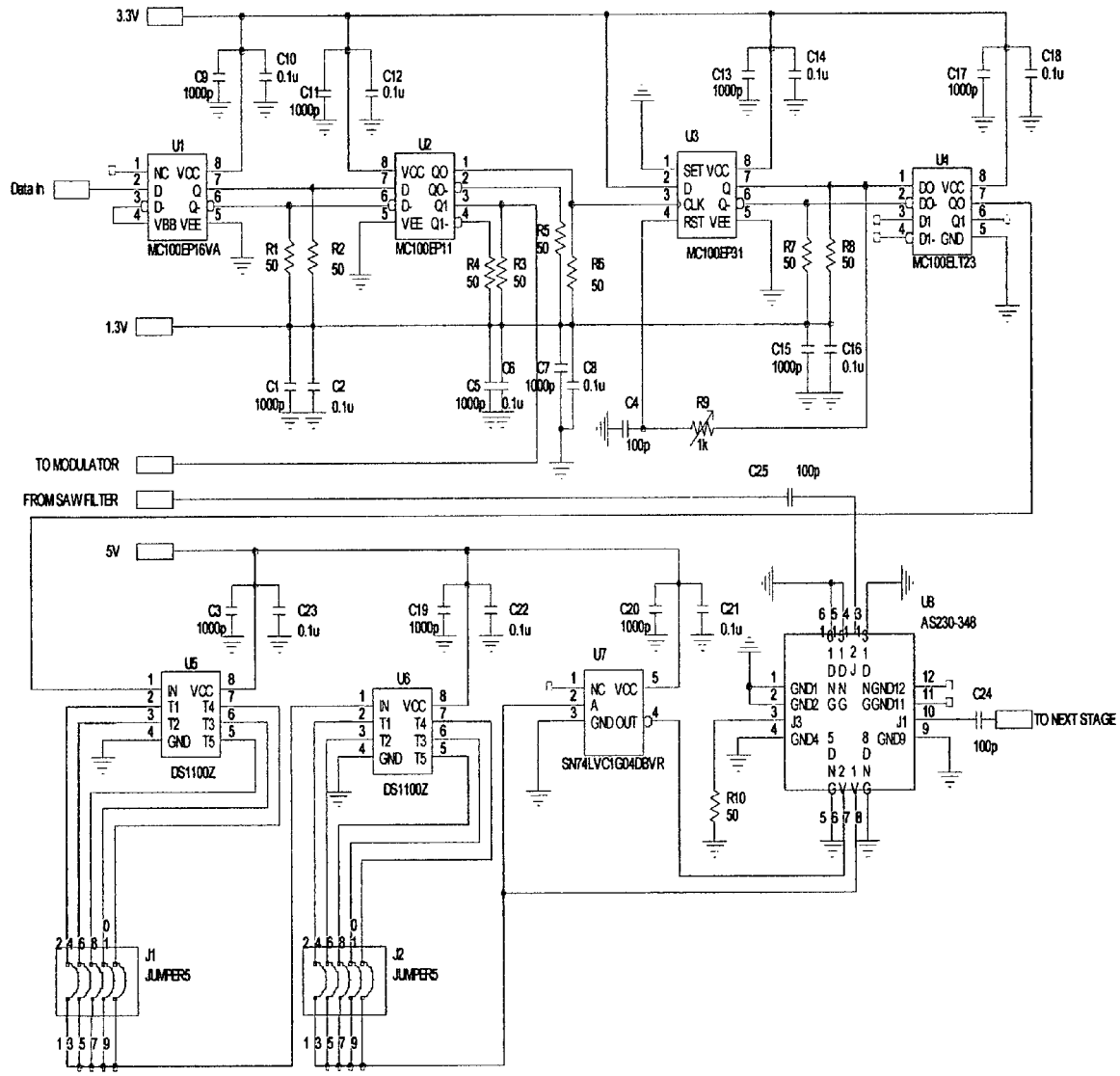
FIG. 11 is a schematic of a series wave damping scheme.

A schematic of a series implementation wave-damping scheme is shown in FIG. 11. In this schematic, the Data In signal is encoded data. The signal is an Emitter Coupled Logic (ECL) signal. U1 and U2 are the ECL driver/receiver. U3 is D types flip flop with Set input. This flip-flop is configured as a one shot circuit. R9 and C4 control the pulse width of the encoded data in signal. U4 is an ECL to TTL translator. The output of this block is fed to two delay lines connected in series. The delay lines match the delay of the pulse (coming out from U4) with the propagation delay of the RF channel (saw filters and amplifiers). The delayed pulse is fed to a Transmit/Receive (T/R) Switch along with the signal from the RF channel. The output of this switch (U8 in schematic) is a wave damped modulated signal. In the schematic, 1000 pf and 0.1 uf capacitors are used for power supply bypassing. C24 and C25 are decoupling capacitors. 50 ohms resistors are used for matching output stage of one chip to the input stage of the other chip.

As mentioned in the above sections, the wave damping scheme can also be implemented in the receiver. Communication receivers usually have analog front ends. The analog front end consists of Low Noise Amplifiers (LNAs) and Band Pass Filters, usually SAW filters. Since SAW filters are used in the receiver, they tend to ring when a pulse is applied to the input of such filter. The implementations of the wave damping scheme described in the above sections can be applied to the receiver. The advantage of implementing the wave damping, scheme in the receiver, besides the reduction of the ringing response, is the improvement in Signal to Noise ratio. The receiver is turned on for a brief period of time only. This time corresponds to the width of the timing pulse. This means that receiver is susceptible to the Additive White Gaussian Noise (AWGN) only for a brief period of time. This improves the signal to noise ratio of the system and it reduces the power consumption of the receiver.

The following are the advantages of the wave damping scheme:

It generates cleaner pulses by removing all the unnecessary signals between them.

Since all the unnecessary signals are removed, it saves power on the transmitter.

System throughput in creases.

Time between pulses can be used to send pulses from multiple xMax transmitters thus making the system multiplex.

On the receive side, the cleaner pulses are easier to demodulate, thus improving system BER performance.

Since certain changes may be made in the above described RF signal modulation system and wave damping method without departing from the scope of the invention herein involved, it is intended that all matter contained in the description thereof or shown in the accompanying figures shall be interpreted as illustrative and not in a limiting sense.

What is claimed is:

1. A method of damping the ringing response of band pass filters for use in impulse and integer cycle modulation system transmitters comprising switching on and off at repeating intervals that are synchronized with a continuously generated impulse signal and band pass filter propagation delays, the ringing response generated from a band pass filter after said band pass filter receives said continuously generated impulse signal by opening the output of said band pass filter or filters, shunting the output to the input of said band pass filter or filters, or shunting the output of said band pass filter or filters to ground wherein said shunting is synchronized with said continuously generated impulse signal and band pass filter propagation delays, such that the in band ringing response of said band pass filters are removed and only main lobes of said impulse signal remains and all unnecessary in band information between said main lobes is removed resulting in narrow band transmissions.

2. A system of damping the ringing response of band pass filters for use in impulse and single cycle modulation system transmitters comprising:

an impulse signal generator generating continuous impulse signals;

a timing device in electrical communication with said impulse signal generator and a switching device said timing device generating timing pulses that are synchronized with the continuously generated impulse signal and band pass filter propagation delays and said timing pulses controlling said switching device; and, said switching device turning on and off at the desired time the ringing response generated from a band pass filter, after said band pass filter receives said continuous impulse signal inputs from said impulse signal generator, by opening the output of said band pass filter or filters, shunting the output to the input of said band pass filter or filters, or shunting the output of said band pass filter or filters to ground wherein said shunting is synchronized with said continuously generated impulse signal and band pass filter propagation delays by said timing pulses of said timing device such that the in band ringing response of said band pass filters are removed and only main lobes of said impulse signal remains and all unnecessary in band information between said main lobes is removed resulting in narrow band transmissions.

3. The system of claim 2 wherein said switching device is in series with and after all of said band pass filters.

4. The system of claim 2 wherein said switching device is in series with and after each of said band pass filters.

5. The system of claim 2 wherein said switching device is in parallel with all of said band pass filters.

6. The system of claim 2 wherein said switching device is in parallel with each of said band pass filters.

7. The system of claim 2 wherein said timing device is implemented in programmable logic circuits such that the system is software controlled and the propagation delay and pulse width of said timing pulses can easily be modified to match changes to the modulation system.

* * * * *